INVENTORS
DONALD R. BRUFFEY
& RICHARD D. STEPHENSON
BY
Sherman & Sherman
ATTORNEYS April 18, 1967 D. R. BRUFFEY ETAL 3,315,090

SWITCHING CIRCUITS UTILIZING OPPOSITE CONDUCTIVITY TRANSISTORS

Filed Oct. 25, 1963 2 Sheets-Sheet 2

INVENTORS
DONALD R. BRUFFEY
& RICHARD D. STEPHENSON

BY Sherman & Sherman
ATTORNEYS

United States Patent Office 3,315,090
Patented Apr. 18, 1967

3,315,090

SWITCHING CIRCUITS UTILIZING OPPOSITE CONDUCTIVITY TRANSISTORS

Donald Richard Bruffey, Silver Spring, and Richard Dale Stephenson, Mount Rainier, Md., assignors to Tri-State Electronics, Inc., Falls Church, Va., a corporation of Virginia Filed Oct. 25, 1963, Ser. No. 318,954
15 Claims. (Cl. 307—88.5)

The present invention relates to switching circuits and more particularly to switching circuits employing a bistable device comprising a pair of opposite conductivity transistors and a diode connected in shunt with the emitter base junction of one of the transistors and in series with the collector emitter path of the other transistor.

In switching applications, such as employed in coupling degraded telegraphy signals to a teletypewriter, it is necessary to provide a circuit that can be driven from a fully open circuit to an almost short circuit condition in response to weak negative and positive and going current impulses. Such a circuit preferably contains a minimum number of components and requires no internal power supply, relying only on power from the teletypewriter. Previous attempts to provide a device having these characteristics have usually resulted in devices of low sensitivity. When high sensitivity was achieved, a large number of components and/or an internal supply were usually required.

According to the present invention, a bistable device having the characteristics desired in a switch of the type mentioned is provided by utilizing a pair of opposite conductivity type transistors and a diode. The diode is connected in series with the collector circuit of one of the transistors and shunts the emitter base junction of the other transistor. The diode and first transistor are connected across the external power supply of a teletypewriter such that they both conduct or are cut off simultaneously. The voltage across the diode controls a regenerative circuit for the first transistor, which circuit includes the collector emitter impedance of the second transistor and selectively couples current from the power supply to the base of the first transistor.

By employing silicon for the second transistor and diode, it is possible to switch the emitter collector path of the first transistor from a fully cut off to a highly conducting state in a relatively short time. The passage of a small current through the collector of the first transistor and the diode in response to a weak signal at the base of the former causes the knee of the diode curve to be reached. This results in considerable forward biasing of the second transistor, and the regenerative application of current by it to the base of the first because the knees of the characteristic curves of the diode and second transistor are approximately at the same voltage.

Both transistors remain conducting until a signal of opposite polarity to that which caused them to conduct is generated. At this time, the regenerative action occurs in the opposite direction and the transistors are driven to cut-off. Cut off occurs rapidly because the diode and second transistor are not forward biased very far beyond the knees of their characteristic curves. To aid in fast cut off, a shunt path is provided for the emitter base junction of at least one of the transistors when the opposite polarity signal is generated. This path quickly removes the voltage formerly forward biasing the junction and prevents the flow of base current to promote cut off.

The basic bistable circuit of the present invention can be utilized either as a neutral or polar relay for controlling a telegraphy load. When used in the former system, a single bistable circuit with the teletypewriter power supply and coil is provided. The switch is opened and closed in response to the transmitted telegraphy pulses or bauds by energizing or deactivating the transistors.

As a polar relay, two somewhat similar bistable circuits are provided. One of the circuits is closed in response to telegraphy pulses of one polarity to couple the load with currents in one direction while the second circuit is closed in response to signals of the opposite polarity to feed currents to the load in the other direction. Connections are provided between the two bistable circuits such that one and only one is activated at a time.

According to a further feature of the invention, the neutral circuit is maintained in an open condition for only a predetermined time period so that if no signal activating the bistable switch into a closed condition is received for said time interval the switch is automatically closed. This enables the derivation of an indication at the teletypewriter that the transmitting station or telegraphy line is malfunctioning. To provide the indication, a resistance capacitance charging circuit is connected in series with the teletypewriter power supply. In response to the voltage across the capacitance attaining a predetermined value, the base of the first transistor is forward biased into conduction. The first transistor is driven into conduction by the regenerative circuit and remains there until its emitter collector path is opened in response to a transmitted signal at predetermined polarity.

Another feature of the invention provides triggering of the bistable circuit as a result of transient changes of the teletypewriter power supply. Triggering is provided by connecting a capacitor in the emitter circuit of the first transistor and by shunting the emitter collector path of the second transistor with a further capacitor. These capacitors conduct the transient variations so that the bias and conduction states of the transistors are suddenly changed.

It is, accordingly, an object of the present invention to provide a new and improved bistable switch.

Another object of the invention is to provide a new and improved bistable switch employing a pair of opposite conductivity transistors that are together driven from cut off into heavy conduction.

A further object of the invention is to provide new and improved neutral and polar bistable switches adapted for use with telegraphy systems, and which can be activated by external power sources, such as exist in teletypewriters.

Still another object of the invention is to provide a new and improved bistable switch that is capable of switching at high speed from virtually a complete open circuit to an almost short circuit which switch utilizes a minimum number of components and does not require an internal power supply.

An additional object of the invention is to provide a new and improved bistable switch particularly adapted for telegraphy receiver use, wherein the switch is automatically closed if no telegraphy signal is received for a redetermined time interval so that an indication of transmitter or line malfunction may be provided.

Yet a further object of the invention is to provide a new and improved bistable switch adapted for telegraphy receiver utilization and to be energized by the receiver power supply, but wherein transient voltage changes of the supply have no effect on the switch.

The above and still further objects, features and advantages of the present invention will become apparent upon consideration of the following detailed description of several specific embodiments thereof, especially when taken in conjunction with the accompanying drawings, wherein.

Figure 1:
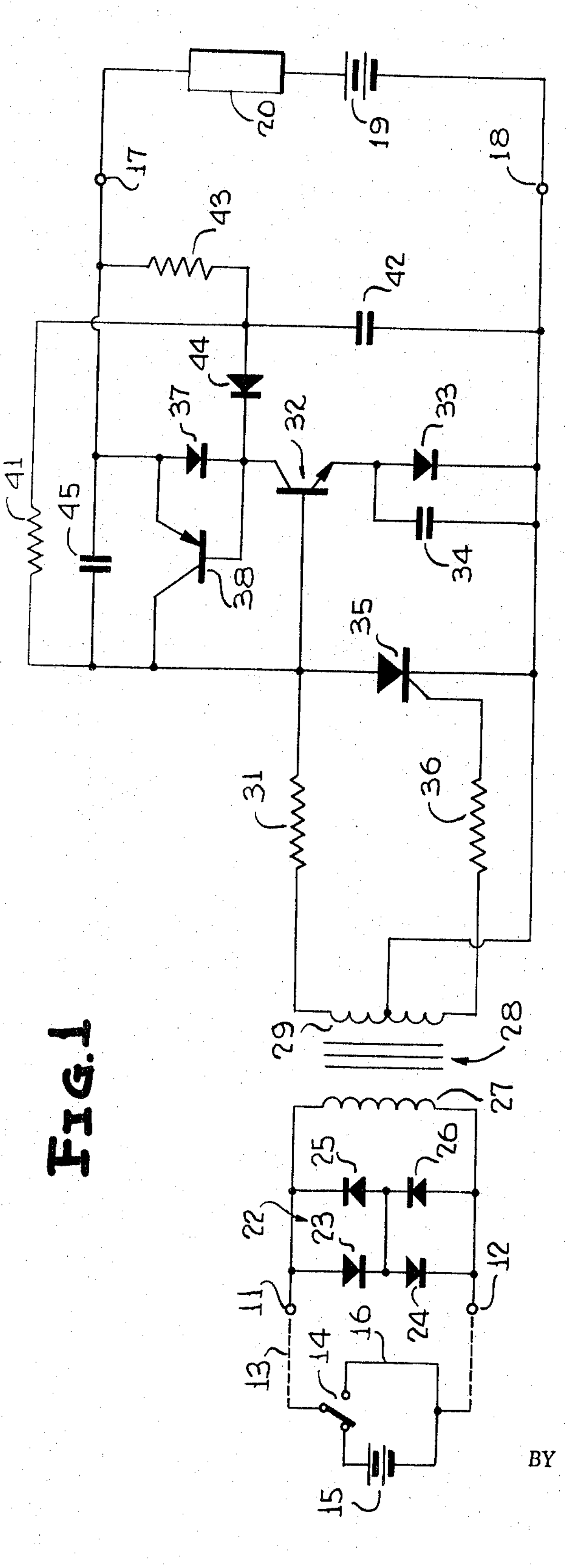
FIGURE 1 is a circuit diagram of a preferred embodiment of the neutral relay system of the present invention.

Reference is now made to FIGURE 1 of the drawings wherein the reference numerals 11 and 12 indicate the input terminals for the neutral relay according to the present invention. Terminals 11 and 12 are responsive to pulse-type signals, such as derived from one end of telegraph line 13 shown in dashed lines. The other end of line 13 is connected to a typical telegraph station including double-pole single throw switch 14 that alternately connects battery 15 and short circuit lead 16 to line 13. In transmission, the mark and space pulses or bauds deriving from switch 14 are frequently degraded so that very little current is applied to terminals 11 and 12. Thus, distinguishing between a mark and space signal is impossible without some type of sensing and amplifying system. In consequence, the bistable sensing and amplifying system of the present invention connects terminals 11 and 12 to output terminals 17 and 18 to open and close the circuit between the latter terminals in response to the weak input pulses.

Connected in series between output terminals 17 and 18 are D.C. source 19 and load 20, which in a typical embodiment are the power source and relay coil of a teletypewriter. Thus, when the bistable circuit connected between terminals 11, 12 and 17, 18 is utilized with a teletypewriter source, it does not require its own internal power supply. Connected to terminals 11 and 12 at the input end of the bistable circuit is a full wave, voltage limiting diode bridge 22. Bridge 22 includes two pairs of series connected diodes, of which diodes 23 and 24 are poled in the forward direction between terminals 11 and 12 and diodes 25 and diodes 25 and 26 are poled in the reverse direction between terminals 11 and 12. The midpoint junctions in the two series connected diode strings are connected together. Thereby, the voltage between terminals 11 and 12 is limited to plus or minus 1.5 volts, approximately.

The voltage-limited signal appearing across bridge 22 is coupled to the primary winding 27 of transformer 28. Secondary winding 29 of transformer 28 has one of its ends connected via current-limiting resistor 31 to the base of low leakage, NPN transistor 32, the emitter of which is connected through the parallel combination of diode 33 and capacitor 34 to the tap of winding 29. Tap 29 is also connected to the anode of silicon controlled rectifier (SCR) 35, the anode of which is connected to the base of transistor 32. The end of winding 29 opposite to that which is connected to resistor 31 is connected through current-limiting resistor 36 to the gate electrode of silicon controlled rectifier 35.

Collector emitter energization for transistor 32 is attained via the voltage applied between terminals 17 and 18 by D.C. source 19. The circuit for energizing the collector of transistor 32 is established via silicon diode 37, poled in the forward direction between terminal 17 and the collector of transistor 32.

Connected as a regenerative circuit element in the collector base circuit for transistor 32 is silicon PNP transistor 38, having its emitter base junction connected in shunt with diode 37. The collector of transistor 38 is connected to the junction between the base of transistor 32, the anode of silicon controlled rectifier 35 and current-limiting resistor 31.

To insure periodic activation of the circuit even if no voltage is applied to terminals 11 and 12 for a predetermined period of time because, e.g., of a failure to power source 15, a timing circuit is provided. The timing circuit includes the series combination of resistor 41, having one of its ends connected to the base of transistor 32, and capacitor 42, having one of its ends connected directly to terminal 18. The junction between resistor 41 and capacitor 42 is supplied by D.C. source 19 via current-limiting resistor 43, whereby the collector of transistor 32 is fed with a positive voltage through the path established by forward conduction through diode 44.

In the event a sudden change in the voltage of source 19 occurs as a result of switching to or from an external load, not shown, capacitors 34 and 45 are provided, the latter being connected in shunt with the emitter collector path of transistor 38. These capacitors conduct the sudden voltage changes of source 19 so that triggering of transistors 32 and 38 does result.

Figure 2:
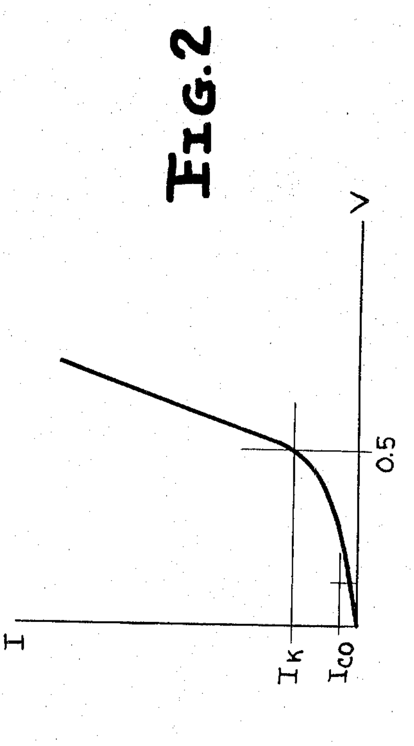
FIGURE 2 is a characteristic curve of current versus voltage for a diode employed in the circuit of FIGURE 1.

Under quiescent conditions, both transistors 32 and 38 are in a cut-off condition, so only leakage current flows through them at such times. Since transistor 32 is of the extremely low leakage type, the bias across diode 37 is quite small, as indicated by the horizontal $I_{co}$ line of FIGURE 2. Since the cathode and anode voltages of diode 37 are approximately the same, transistor 38 is cut off except for leakage current, i.e., there is no forward biasing of the base emitter junction of transistor 38.

In response to switch 14 being connected to D.C. power source 15 at the telegraph transmitting station, a positive voltage is induced at the end of secondary 29 to which resistor 31 is connected. This voltage forward biases NPN transistor 32. If the current supplied to the base of transistor 32 in response to the positive current resulting from source 15 being switched into the circuit is small, transistor 32 initially conducts at a low level. In response to the low collector emitter current through transistor 32, silicon diode 37 conducts more heavily so that the current flowing through it and through the collector of transistor 32 reaches the point $I_k$, at the knee of the diode characteristic. When the knee of the diode characteristic curve is reached, the cathode voltage of diode 37 is approximately one-half volt less than the anode voltage thereof. At this voltage, the base of transistor 38 is forward biased sufficiently to enable emitter collector current to flow therein. In consequence, current is supplied from terminal 17 through the relatively low impedence path between the emitter and collector of transistor 38 to the base of transistor 32.

Increased positive base current to transistor 32 causes heavier conduction through its collector emitter circuit and through diode 37. Despite diode 37 conducting more heavily, however, the base emitter junction of transistor 38 remains forward biased to approximately the same extent as when the diode was conducting at $I_k$. This is because the knee of the diode curve has been reached and the voltage drop across it does not increase nearly as fast for currents above $I_k$ as it does between $I_{co}$ and $I_k$. It should thus be apparent that transistor 32 remains conductive through the path established via transistor 38 even though the voltage across secondary 29 drops slowly to zero, as it does when switch 14 engages source 15 for relatively long time periods.

Because transistor 38 is of the silicon type, the knee on its characteristic curve occurs at approximately the same place as the knee for the silicon diode 37. Thus the base emitter junction of transistor 38 is driven heavily forward biased at about the same time that the characteristic curve of diode 37 crosses its knee, at a current $I_k$ and a voltage of approximately 0.5 volt. Because diode 37 is employed, rather than a resistor as in prior art circuits of which we are familiar, transistor 32 is biased at cut off under quiescent conditions. Also, the diode 37 enables transistor 32 to be quickly switched from cut off to full conduction so that switching rates of at least 20 kc. may be attained. These improvements result because diode 37 possesses the non-linear characteristics illustrated in FIGURE 2, while a conventional resistor has linear voltage current characteristics.

As indicated supra, transistors 32 and 38 remain in heavy conduction even though no positive voltage is applied by winding 29 to resistor 31. In response to this heavy conduction, load 20 is activated by the current flowing through it from source 19 and the current path established via diode 37, transistor 32 and diode 33.

When the telegraphy pulse or baud terminates, switch 14 is energized so that short circuit 16 is connected across line 13. This causes a negative voltage to be induced in primary 28, and a positive voltage to be induced in the end of winding 29 resulting in the application by winding 29 of positive and negative currents to resistors 36 and 31, respectively. The positive current applied to resistor 36 is fed to the control gate of SCR 35, whereby the SCR conducts heavily. The impedance of SCR 35 is now considerably less than the base emitter impedance of transistor 32 so that the latter junction is effectively short-circuited. Thereby, no positive current flows from the collector of transistor 38 to the base of transistor 32, all of it being shunted through SCR 35 to terminal 18. At the same time, current is drawn from the base of transistor 32 through resistor 31 to winding 29. The voltage at the anode of SCR 35 remains positive even though current is being drawn to winding 29 through resistor 31. This is because diode 33 has a tendency to maintain the emitter of transistor 32 conducting. This voltage is reflected to the base of transistor 32 and the anode of SCR 35. In consequence, the anode of SCR is forward biased despite the application of a negative voltage to winding 27, and short circuiting the base emitter junction of transistor 32 is insured.

As a result of SCR 35 being activated and the negative current flow through resistor 31, transistor 32 cuts off, the current flowing through diode 37 returns to $I_{co}$, and the forward bias for transistor 38 is removed. Transistor 38 thereby cuts off, causing the regenerative current for the base of transistor 32 to be opened so that transistor 32 remains cut off. Thus, the conduction path between terminals 17 and 18 opens, no power is derived from source 19 and load 20 becomes de-energized after switch 14 engages shorting bar 16.

With transistors 32 and 38 cut off, the charge on capacitor 34 is quickly dissipated through diode 33, whereby the emitter and base voltages of transistor 32 assume the same potential as terminal 18. When this occurs, there is still some negative current being drawn by winding 29 from the anode of SCR 35 via resistor 31. The negative current causes SCR 35 to cut off so that the circuit is returned to its quiescent condition, i.e., transistors 32 and 38, as well as SCR 35 being cut off.

As mentioned supra, transistor 32 is energized periodically if, for a predetermined time period, no positive voltage is applied to transformer 27 by source 15. This is accomplished to prevent the printer driven by load 20 from running in an open condition. The operation of the timing circuit including resistor 41 and capacitor 42 is as follows. Whenever transistor 32 is not conducting, capacitor 42 is being charged by source 19 via load 20 and resistor 43. After a predetermined time period, the voltage across capacitor 42 attains a high enough value so that a sufficient positive bias is applied to the base of transistor 32 via resistor 41 to cause conduction between the transistor emitter and collector. Forward biasing of transistor 32 results in conduction through the emitter collector path of transistor 38 and energization of load 20.

In response to conduction of transistor 32, as a result of a positive voltage being applied to winding 27 or in response to capacitor 42 being sufficiently charged, diode 44 becomes forward biased. Forward biasing of diode 44 causes the residual charge remaining on capacitor 42 to be dissipated through the low impedance path existing between the collector and the emitter of transistor 32. Hence, capacitor 42 is reset to its normal low voltage and will once again activate transistor 32 only after a predetermined time period following the subsequent transistor deactivation. It should thus be apparent that load 20 is energized as long as switch 14 is connected to battery 15 and may be energized in response to very small, degraded pulses that are applied to winding 27. Also, load 20 is de-energized in response to activation of switch 14 into contact with shorting lead 16.

Figure 3:
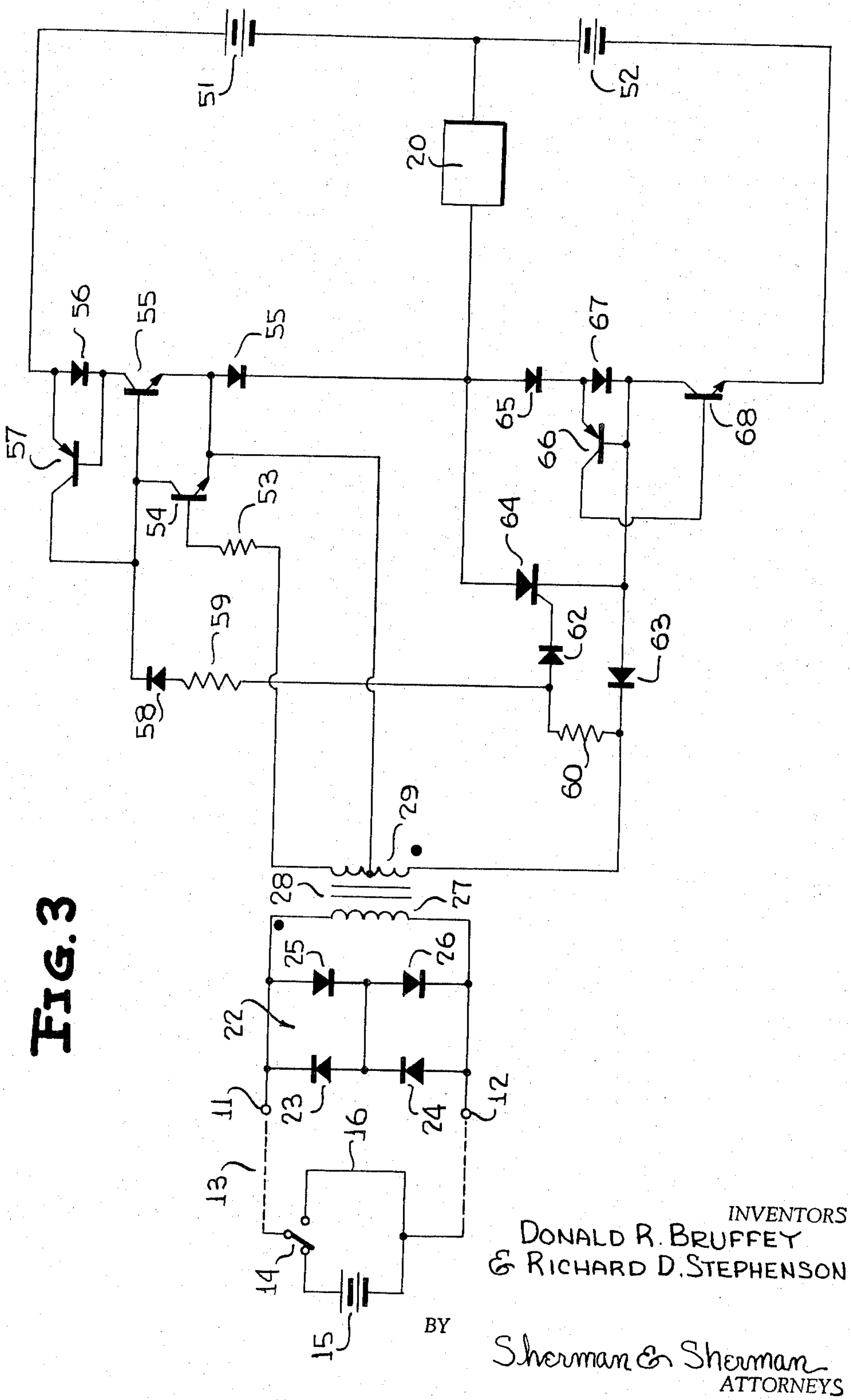
FIGURE 3 is a circuit diagram of a preferred embodiment of a polar relay according to the present invention.

The circuit of FIGURE 3 is provided when it is desired to energize a load by currents of one polarity when switch 14 engages battery 15 or by currents of second polarity when switch 14 contacts shorting bar 16. In FIGURE 3, the transmitter station includes switch 14, battery 15 and shorting bar 16, as in FIGURE 1.

In the circuit of FIGURE 3, the transmitting station, transmission line 13, limiting or clipping bridge 22 and transformer 28 are identical with the corresponding structures of FIGURE 1. Load 20, however, is connected to two separate, bistable switching circuits, one of which is energized by positive teletypewriter D.C. power source 51, the other of which is energized by negative teletypewriter D.C. power source 52. Thus, as in FIGURE 1, the circuit of FIGURE 3 requires no internal driving source and can be energized by the polarized teletypewriter power supply.

Secondary winding 29 of transformer 28 is wound in a reversed direction from primary winding 27 so that a positive voltage supplied to the latter at its dotted end induces a positive voltage in secondary 29 at its dotted end. The undotted end of winding 29 is connected by current limiting resistor 53 to the base of NPN transistor 54 that shunts the base emitter path of NPN transistor 55. To provide a return path to winding 29, the emitter of transistor 54 is connected to the tap on the winding. Transistor 55 is series connected with source 51 and load 20 via the D.C. path established through switching diode 56 and load diode 55 that establishes the necessary bias for the emitter base junction of transistor 54.

Diode 56 shunts the base emitter path of PNP transistor 57, the collector of which is connected to the base of transistor 55. Base current for transistor 55 is supplied through the series path including isolating diode 58, and current limiting resistors 59 and 60, the latter being connected to the dotted end of winding 29.

Connected to either ends of resistor 60 are oppositely poled diodes 62 and 63, having their cathodes and anodes connected to the gate and cathode of silicon controlled rectifier 64. Rectifier 64, in combination with load diode 65, shunts the base emitter path of switching transistor 66. Transistor 66 has its base emitter path shunted by silicon diode 67 which is connected in series between load 20 and the negative terminal of supply 52 via the emitter collector path of transistor 68 and diode 65. The base of transistor 68 is connected directly to the collector of transistor 66 to establish a regenerative circuit.

It is thus apparent that in FIGURE 3 there are provide two switching circuits essentially like the bistable circuit comprising transistors 32 and 38 and diode 37 of FIGURE 1. The first bistable circuit of FIGURE 3 includes transistors 55 and 57 and diodes 56, while the second comprises transistors 66 and 68 and diode 67.

In operation, the bistable circuit including transistors 66 and 68 and diode 67 is closed when switch 14 engages shorting bar 16 so that a current path exists from power supply 52 through load 20 while the circuit including transistors 55 and 57 and diode 56 is open and no power is supplied by power source 51 to load 20.

In response to switch 14 connecting source 15 to line 13, a positive voltage is induced at the dotted end of winding 29. This positive voltage is coupled via resistors 59 and 60 and isolating diode 58 to the base of NPN transistor 55 to bring that transistor into conduction. Even though the current applied to the base of transistor 55 is slight, the regenerative feed back path including transistor 57 and diode 56 supplies sufficient current from source 51 to the transistor 55 base to enable the transistor to be activated into hard conduction. Because the emitter collector path of transistor 57 is maintained at a relatively low impedance once transistor 55 is energized into a conducting state, the latter transistor remains in conduction even though the voltage at the dotted end of transformer 29 slowly drops to zero. Thereby, the conduction path betwen source 51 and load 20 remains closed even though the voltage at the undotted end of transformer 28 drops to a zero value.

In response to the positive voltage at the dotted end winding 29, that caused transistor 55 to conduct the gate electrode of silicon controlled rectifier 64 is forward biased and a low impedance is thereby provided between the SCR anode and cathode. Thus, the emitter and base of transistor 66 are effectively connected together via the low impedance path comprising rectifier 64 and diode 65. In consequence, base current to transistor 66 decreases and the emitter collector path of that transistor becomes a higher impedance. In response to a high impedance path provided between the collector and emitter of transistor 66, current to the base of transistor 68 decreases. This results in decreased collector current for transistor 68 and lower voltage across diode 67. The lower voltage across diode 67 is reflected to the base emitter junction of transistor 66. The process is regenerative until transistors 66 and 68 are both cut off and no current path exists from supply 52 through load 20. The positive voltage at the dotted end of winding 29 has no nullifying effect on the operation of transistor 66 because diode 63 blocks the flow of positive current between the winding and transistor base.

It should now be apparent that the direction of current flow through load 20 is reversed in response to energization of contact 14 with power source 15.

In response to switch 16 being moved out of engagement with source 15 and into contact with shorting bar 16, there is induced a negative voltage at the dotted end of windings 27 and 29, whereby the undotted end of winding 29 becomes positive relative to the dotted end. Since the voltage at the undotted end of winding 29 is more positive than the voltage at the tap, the base of transistor 54 is forward biased so that a relatively low impedance path is provided between the collector and emitter of that transistor. The low impedance path of transistor 54 effectively short circuits the emitter base junction of transistor 55 and that transistor is cut off. Cut off of transistor 55 causes transistor 57 and diode 56 to also cut off in a manner described supra in connection with FIGURE 1.

The negative voltage now generated at the dotted end of transformer 29 does not swamp the positive voltage at the collector of transistor 54 because of the decoupling action of diode 58. The same negative voltage has no effect on SCR 64 because diode 62 is poled in a manner whereby conduction to the control electrode of the SCR is prevented.

The negative voltage at the dotted end of winding 29 is however, coupled through the low impedance path of diode 63 to the base of transistor 66. This causes the base emitter junction of transistor 66 to be forward biased and enables current to flow from source 52 through load 20, diode 65 and resistor 66 to the base of transistor 68. Thereby, transistor 68 begins to conduct, the voltage across diode 67 increases and the base emitter junction of transistor 66 is more forward biased. Forward biasing base emitter junction of transistor 66 increases the current supplied the base of transistor 68 and a regenerative feedback path is provided to maintain the path between source 52 and load 20 closed. This path remains closed even after the negative impulse that is A.C. coupled via transformer 28 to 55 and 68 slowly drops to zero voltage. Of course, the path through transistor 55 remains cut off while transistor 68 is conducting since there is no possibility of positive current being applied to the base of transistor 55 except by an input trigger from transformer 28. Likewise, transistor 68 remains cut off when transistor 55 is conducting since there is no possibility of negative current being supplied through diode 63 to the base of transistor 66 except via a negative trigger from the dotted end of transformer 28.

It should now be apparent that the direction of current through load 20 depends upon whether switch 14 engages battery 15 or shorting bar 16.

While we have described and illustrated several specific embodiments of our invention, it will be clear that variations of the details of construction which are specifically illustrated and described may be resorted to without departing from the true spirit and scope of the invention as defined in the appended claims.

What is claimed is:

1. A bistable circuit responsive to a signal source comprising a pair of terminals adapted to be connected to a D.C. source, a pair of opposite conductivity type, normally cut-off transistors, the emitter collector path of one of said transistors being connected in series circuit between said terminals, said series circuit further including a diode poled in the direction of current flow through the emitter and collector of said first transistor, the emitter base junction of said second transistor being connected in a D.C. shunt circuit across said diode, said junction and diode being connected to each other to be forward biased simultaneously in response to the voltage across them, a D.C. path connecting the collector of said second transistor to the base of said first transistor for coupling emitter collector current of the second transistor to the base of the first transistor, and means coupling said signal source to an electrode of one of said transistors to change the conducting state of both said transistors in a like manner in response to said source attaining a predetermined amplitude, wherein the knees of the characteristic curves of said diode and junction are at substantially the same voltage so that substantial conduction through said transistor is controlled by and occurs simultaneously with said diode being driven to the knee of its characteristic curve, the voltage of said knees being different from zero.

2. The circuit of claim 1 wherein said diode and second transistor are silicon semiconductors.

3. A bistable circuit responsive to a signal source comprising a pair of terminals adapted to be connected to a D.C. source, a pair of opposite conductivity type transistors, the emitter collector path of one of said transistors being connected in series circuit between said terminals, said series circuit further including a diode poled in the direction of current flow through the emitter and collector of said first transistor, the emitter base junction of said second transistor shunting said diode, said junction and diode being connected to each other to be forward biased simultaneously in response to the voltage across them, a D.C. path connecting the collector of said second transistor to the base of said first transistor for coupling emitter collector current of the second transistor to the base of the first transistor, a switch having a pair of electrodes being connected between the base of said first transistor and the other of said terminals, and means coupling said signal source to an electrode of one of said transistors to change the conducting state of both said transistors into a like, second state in response to said source attaining a first predetermined amplitude and to activate said switch into its low impedance state in response to said source attaining a second predetermined amplitude.

4. A circuit for driving a load in response to a received telegraph signal and from a D.C. power supply external to the circuit and in series with the load comprising a pair of opposite conductivity type transistors, a diode connected in the collector circuit of one of said transistors and poled in the direction of current flow between the emitter and collector of said one transistor, said diode and the emitter collector path of said one transistor being connected in series circuit with said load and said source, the emitter base junction of said other transistor shunting said diode, said diode and junction being connected to each other to be forward biased simultaneously in response to the voltage across them, the collector of said other transistor being connected to the base of said one transistor, and A.C. coupling means for feeding the telegraphy signal to an electrode of one of the transistors, the conducting state of both said transistors being activated into a highly conducting state in response to the signal amplitude deriving from said coupling means attaining a first value, and means responsive to said coupling means for driving the conducting state of both said transistors into a cut off conducting state in response to and substantially simultaneously with the signal amplitude deriving from said coupling means attaining a second value.

5. The circuit of claim 4 further including a charging circuit coupled to an electrode of one of said transistors, said charging circuit reaching a voltage to change the conduction state of said transistors if no change in the received signal occurs within a predetermined time period.

6. The circuit of claim 5 wherein said charging circuit is responsive to said D.C. power source and includes a reactance, said reactance being coupled to the collector of said second transistor.

7. The circuit of claim 6 wherein said reactance comprises a capacitor shunting said first transistor, and a diode coupling said capacitor to the collector of said first transistor.

8. The circuit of claim 4 further including a pair of capacitors, one of said capacitors being connected to an electrode of a different one of said transistors for conducting transient voltage changes of said power supply.

9. The circuit of claim 4 wherein said means for driving includes a silicon controlled rectifier having its anode cathode path shunting the emitter base junction of said first transistor, the control electrode of said rectifier being responsive to the signal deriving from coupling means, said rectifier being activated to short circuit the base emitter junction of said first transistor in response to the signal amplitude deriving from said coupling means attaining said second value.

10. The circuit of claim 9 further including a diode connected to the emitter of said first transistor and in series with said load and power supply.

11. A polar relay system for selectively applying opposite polarity currents from a tapped power supply to a load in response to received telegraphy signals comprising a pair of bistable circuits, one of said circuits being connected from one polarity of said supply to said load, the other of said circuits being connected from the other polarity of said supply to said load, each of said bistable circuits including; a pair of opposite conductivity type transistors, the emitter collector path of one of said transistors being connected in series circuit with said load, said tap and one polarity of said source, a diode in said series circuit, said diode shunting the emitter base junction of said second transistor, said diode being poled in the direction of current flow through said one transistor, and in the forward bias direction of said junction, the base of said first transistor and the collector of said second transistor being connected together, A.C. coupling means for feeding the telegraphy signal to an electrode of one of said transistors, the conducting state of both said transistors being activated into a like, first conducting state in response to the signal amplitude deriving from said coupling means attaining a first value, the conducting state of both said transistors being activated into a like, second conducting state in response to and substantially simultaneously with the signal amplitude deriving from said coupling means attaining a second value; and means connecting said bistable elements to said coupling means in an opposite manner so that only one of said bistable circuits provides a conduction path from said power source to said load at a time.

12. The system of claim 11 wherein said coupling means includes a transformer winding; said connecting means including a first unidirectional element connected between one end of said transformer and the base electrode of said one transistor of one of said bistable elements, and a second unidirectional element connected between said transformer end and the base electrode of the other transistor of the other of said bistable elements, said unidirectional elements being poled in opposite directions.

13. The system of claim 12 further including a first selectively activated shunt circuit for the base emitter junction of one transistor of the first bistable element and a second selectively activated shunt circuit for the base emitter junction of the other transistor of the other bistable element, said first shunt circuit being activated in response to the signal amplitude deriving from said coupling means attaining said first value, said second shunt circuit being activated in response to the signal amplitude deriving from said coupling means attaining said second value.

14. The system of claim 11 further including a first selectively activated shunt circuit for the base emitter junction of one transistor of the first bistable element and a second selectively activated shunt circuit for the base emitter junction of the other transistor of the other bistable element, said first shunt circuit being activated in response to the signal amplitude deriving from said coupling means attaining said first value, said second shunt circuit being activated in response to the signal amplitude deriving from said coupling means attaining said second value.

15. A bistable circuit responsive to a signal source comprising a pair of terminals adapted to be connected to a D.C. source, first, second, third and fourth regions of semiconductor material doped with charged carriers of a first polarity, fifth, sixth, seventh and eighth regions of semiconductor material doped with charged carriers of a second polarity, said fifth region being connected to form separate junctions with said first and second regions, said third region being connected to form separate junctions with said sixth and seventh regions, said fourth and eighth regions being connected to form a junction, a first low impedance D.C. connection between said fifth and sixth regions, a second low impedance D.C. connection between said second, third and fourth regions, and a third low impedance D.C. connection between said seventh and eighth regions, wherein the knee of the characteristic curve of the junction between the fourth and eighth regions is at substantially the same voltage as the knee of the junction between the third and seventh regions; means for normally biasing into a cut-off state each of: the junction between the fourth and eighth regions, the conduction path between said first and second regions through said fifth region and the conduction path between said fifth and seventh regions through said third region into a normally cut-off state; and means coupling said signal source to one of said regions for establishing, in response to said source attaining a predetermined amplitude, a low impedance path simultaneously between:

aid fourth and eighth regions, said first and second regions through said fifth region, and said sixth and seventh egions through said third region; the voltages of said knees being different from zero so that substantial conduction between said sixth and seventh regions is controlled by the junction between said fourth and eighth regions being driven to the knee of the characteristic curve of the fourth and eighth junctions.

References Cited by the Examiner

UNITED STATES PATENTS

| | | | |
|---|---|---|---|
| 2,770,732 | 11/1956 | Clapper | 307—88.5 |
| 3,025,415 | 3/1962 | Chong | 307—88.5 |
| 3,183,366 | 5/1965 | Brode | 307—88.5 |

ARTHUR GAUSS, *Primary Examiner.*

J. BUSCH, *Assistant Examiner.*